(12) United States Patent
Won et al.

(10) Patent No.: US 9,614,132 B2
(45) Date of Patent: Apr. 4, 2017

(54) LIGHT EMITTING DEVICE AND METHOD OF FABRICATING THE SAME

(75) Inventors: Yu Ho Won, Seoul (KR); Geun Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 277 days.

(21) Appl. No.: 13/396,192

(22) Filed: Feb. 14, 2012

(65) Prior Publication Data

US 2012/0146080 A1 Jun. 14, 2012

Related U.S. Application Data

(63) Continuation of application No. 12/667,488, filed as application No. PCT/KR2008/003922 on Jul. 3, 2008, now Pat. No. 8,138,513.

(30) Foreign Application Priority Data

Jul. 4, 2007 (KR) .................. 10-2007-0067123

(51) Int. Cl.
*H01L 33/50* (2010.01)

(52) U.S. Cl.
CPC .......... *H01L 33/508* (2013.01); *H01L 33/505* (2013.01); *H01L 2224/14* (2013.01); *H01L 2224/48091* (2013.01); *H01L 2224/49107* (2013.01); *H01L 2224/8592* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 6,184,544 B1 | 2/2001 | Toda et al. | |
| 6,744,196 B1* | 6/2004 | Jeon | 313/498 |
| 6,956,247 B1 | 10/2005 | Stockman | |
| 7,955,531 B1* | 6/2011 | Khanarian | 264/1.7 |
| 2003/0062530 A1 | 4/2003 | Okazaki et al. | |
| 2005/0077531 A1 | 4/2005 | Kim | |
| 2005/0230691 A1* | 10/2005 | Amiotti et al. | 257/79 |
| 2005/0265404 A1* | 12/2005 | Ashdown | 372/20 |
| 2005/0274967 A1* | 12/2005 | Martin et al. | 257/98 |
| 2006/0003477 A1 | 1/2006 | Braune et al. | |
| 2006/0056024 A1* | 3/2006 | Ahn et al. | 359/486 |
| 2006/0071223 A1 | 4/2006 | Richter et al. | |
| 2006/0204865 A1* | 9/2006 | Erchak et al. | 430/7 |
| 2006/0258028 A1 | 11/2006 | Paolini et al. | |
| 2007/0034886 A1 | 2/2007 | Wong et al. | |
| 2007/0176193 A1* | 8/2007 | Nagai | 257/98 |

(Continued)

FOREIGN PATENT DOCUMENTS

| | | |
|---|---|---|
| EP | 1 396 891 A2 | 3/2003 |
| EP | 1 394 867 A2 | 12/2003 |

(Continued)

*Primary Examiner* — Whitney T Moore
*Assistant Examiner* — Scott R Wilson
(74) *Attorney, Agent, or Firm* — Birch, Stewart, Kolasch & Birch, LLP

(57) ABSTRACT

A light emitting device package includes substrate; first and second conduction members on the substrate; a light emitting diode on the substrate, the light emitting diode being electrically connected with the first and second conduction members; and a phosphor layer on the light emitting diode.

13 Claims, 6 Drawing Sheets

(56) References Cited

U.S. PATENT DOCUMENTS

| | | |
|---|---|---|
| 2007/0228931 A1 | 10/2007 | Kim et al. |
| 2007/0285000 A1* | 12/2007 | Lim et al. .................... 313/501 |
| 2008/0023714 A1* | 1/2008 | Chae et al. .................... 257/98 |
| 2008/0179611 A1 | 7/2008 | Chitnis et al. |
| 2008/0231166 A1* | 9/2008 | Su .............................. 313/498 |
| 2009/0039365 A1* | 2/2009 | Andrews et al. ............. 257/98 |
| 2009/0039375 A1 | 2/2009 | LeToquin et al. |
| 2009/0261358 A1* | 10/2009 | Chitnis et al. ................ 257/88 |
| 2009/0286337 A1* | 11/2009 | Lee et al. ..................... 438/27 |

FOREIGN PATENT DOCUMENTS

| | | |
|---|---|---|
| JP | 9-153645 A | 6/1997 |
| JP | 2005-116998 A | 4/2005 |
| KR | 10-2005-0034812 A | 4/2005 |
| WO | WO 2005/064697 A1 | 7/2005 |
| WO | WO 2006/036251 A1 | 4/2006 |

\* cited by examiner

LIGHT EMITTING DEVICE AND METHOD OF FABRICATING THE SAME

CROSS-REFERENCE TO RELATED APPLICATIONS

This application is a Continuation of co-pending application Ser. No. 12/667,488 filed on Dec. 31, 2009, which claims priority of Application No. 10-2007-0067123 filed in the Republic of Korea on Jul. 4, 2007 under 35 U.S.C. 119; the entire contents of all are hereby incorporated by reference.

TECHNICAL FIELD

The present disclosure relates to a light emitting device and a manufacturing method thereof.

BACKGROUND ART

Recently, a light emitting diode (LED) is widely used as a light emitting device.

The LED is used for various fields such as a light source of a display device, a lighting apparatus that can replace a fluorescent lamp or an incandescent electric lamp, and a light source used for an automobile.

The LED can be manufactured to emit light of various colors such as red, yellow, green, and blue. White light can be emitted using a phosphor or combining color light emitted from a plurality of LEDs.

Particularly, a light emitting diode emitting white light can be used for various fields, so lots of studies on a light emitting device of a good efficiency are under progress.

Generally, to realize white light in a light emitting device, the light emitting device is formed by combining an LED primarily emitting light in a blue wavelength and a phosphor excited by the light in the blue wavelength emitted from the LED to emit excited light in a yellow wavelength. In the light emitting device using this method, white light realization of the light emitting device is greatly influenced by the efficiency of a phosphor layer including the phosphor.

For example, light emitted from the LED and/or excited light excited by light emitted from the LED are frequently not emitted to the outside from the light emitting device but disappear inside the light emitting device due to a difference in the refractive index between a material forming the LED and air outside the light emitting device, so that light efficiency of the light emitting device is reduced.

Therefore, it is required to allow light emitted from the LED and/or excited light excited by light emitted from the LED to be effectively emitted from the light emitting device.

DISCLOSURE OF INVENTION

Technical Problem

Embodiments provide a light emitting device of a new structure and a manufacturing method thereof.

Embodiments also provide a light emitting device with an improved light efficiency and a manufacturing method thereof.

Technical Solution

In an embodiment, a light emitting device comprises: a light emitting diode; and a phosphor layer on the light emitting diode, the phosphor layer comprising patterns.

In an embodiment, a light emitting device package comprises: a substrate; first and second conduction members on the substrate; a light emitting diode on the substrate, the light emitting diode being electrically connected with the first and second condition members; and a phosphor layer on the light emitting diode.

In an embodiment, a method for manufacturing a light emitting device comprises: forming a light emitting diode on a substrate; forming an electrode layer providing power to the light emitting diode; and forming a phosphor layer in which a pattern is formed on an outer surface of the light emitting diode.

Advantageous Effects

Embodiments can provide a light emitting device of a new structure and a manufacturing method thereof.

Embodiments can also provide a light emitting device with an improved light efficiency and a manufacturing method thereof.

MODE FOR THE INVENTION

Figure 1:
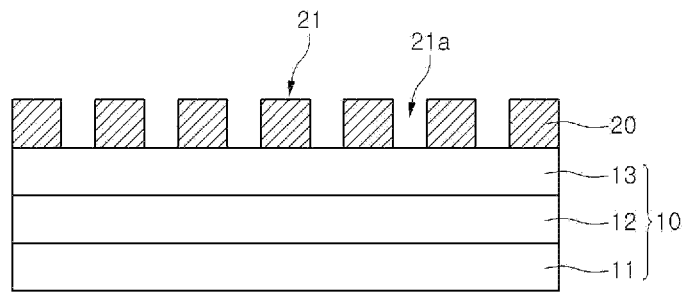
FIGS. 1 to 6 are exemplary views illustrating various types of an LED and a phosphor layer according to an embodiment.

Reference will now be made in detail to the embodiments of the present disclosure with reference to the accompanying drawings.

While numerous modifications and variations are allowed by the present disclosure, specific embodiments thereof are exemplarily illustrated in the drawings, which will be described in detail. However, the embodiments are not intended for limiting the present disclosure to the disclosed specific forms but rather the present disclosure include all modifications, equivalents, and alternatives matching with the spirit of the present disclosure as defined by the appended claims.

Same reference numerals denote the same elements through the descriptions of the drawings. The dimensions of layers and regions in the drawings are exaggerated for clarity. Also, each embodiment described here includes an alternative embodiment of a complementary conduction type.

In the case where an element such as a layer, region, and a substrate is mentioned as being on another element, it is understood that it is directly on the another element or an intervening element may exist therebetween. In the case where a portion of an element such as a surface is expressed as an inner portion, it is understood that the portion is located far from the outer side of a device than other portions of the element.

It is understood that these terminologies are intended to include other directions of a device in addition to a direction described in the drawings. Last, a terminology 'directly' means that there is no intervening element. As used here, a terminology 'and/or' includes one or any combination of two or more, and all combinations of described associated items.

The present disclosure primarily describes an LED and a phosphor layer. That is, embodiments disclose a position relation or a coupling relation between a light emitting diode and a phosphor layer, and discloses the shape of the phosphor layer.

FIGS. 1 to 6 are exemplary views illustrating various types of an LED and a phosphor layer according to an embodiment. In describing FIGS. 1 to 6, repeated descriptions are omitted.

On the first place, referring to FIG. 1, a phosphor layer 20 is formed on an LED 10.

The LED 10 includes a first conduction type semiconductor layer 11, an active layer 12, and a second conduction type semiconductor layer 13. The structure of the LED 10 is not limited to that illustrated in the drawing but can be designed variously.

The phosphor layer 20 is formed of a material including a phosphor. For example, a resin including the phosphor can be used.

The phosphor layer 20 can be formed after manufacturing of the LED 10 is completed, or while the LED 10 is manufactured.

In FIG. 1, the phosphor layer 20 is formed on the LED 10 and has predetermined patterns 21. For example, the pattern 21 can be formed in various shapes such as a circle, a donut, a waffle, a honeycomb, and a square when viewed from above. Also, the pattern 21 can be formed in a shape such as a cylindrical shape, a donut, a hemisphere, a hexagonal prism, a quadrangular prism, a grating pattern, a tetrahedron, and a pyramid.

since the phosphor layer 20 is partially formed in predetermined patterns on the LED 10, the upper surface of the LED 10 is partially exposed to the upper direction by the phosphor layer 20.

For example, the period of the patterns 21 of the phosphor layer 20 can be 0.8 to 5 .mu.m, and the height of the patterns 21 can be 300 to 3000 nm.

Figure 2:
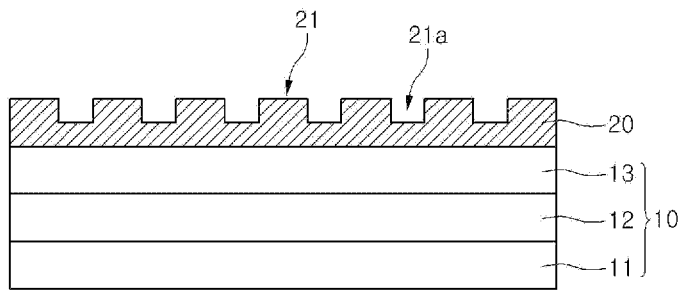

Referring to FIG. 2, unlike FIG. 1, a phosphor layer 20 can be formed on the entire upper surface of the LED 10.

The phosphor layer 20 shown in FIG. 2 has a first thickness and a second thickness. A portion having the first thickness can be formed in the predetermined patterns 21 as illustrated in FIG. 1.

A difference between the phosphor layers illustrated in FIGS. 1 and 2 lies in a different depth of a groove 21a between the patterns 21, by which whether the upper surface of the LED 10 is exposed is determined. The depth of the groove 21a between the patterns 21 can be determined by an etch amount of the phosphor layer 20.

Figure 3:
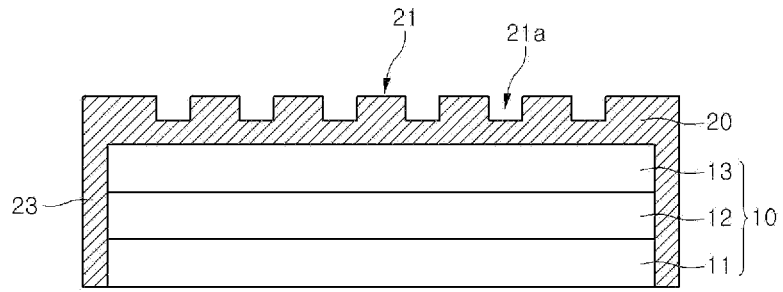

Referring to FIG. 3, the phosphor layer 20 can be formed on the lateral surface of the LED 10. A phosphor layer 23 formed on the lateral surface can have a predetermined thickness, and performs color conversion on light emitted to the lateral surfaces of the LED 10.

Figure 4:
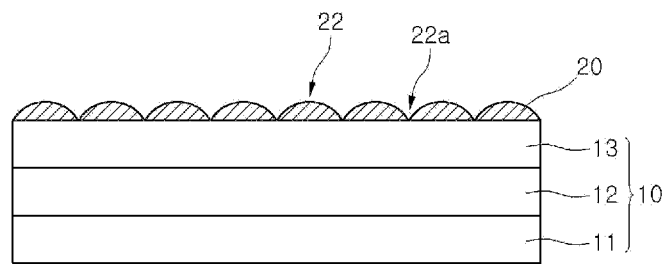

Referring to FIG. 4, the phosphor layer 20 can have hemisphere-shaped patterns 22. Also, a groove 22a between the hemisphere shaped patterns 22 can be formed to have an almost the same thickness as the thickness of the phosphor layer 20. Though the upper surface of the LED 10 is not exposed by the grooves 22a formed in the phosphor layer 20 in FIG. 4, the upper surface of the LED 10 can be partially exposed by increasing an etch amount of the phosphor layer 20.

The hemisphere-shaped patterns 22 are formed in the following process. The phosphor layer 20 is formed using a method such as metal organic chemical vapor deposition (MOCVD), atomic layer deposition (ALD), a radio frequency (RF)-sputter, an e-beam evaporator, and a thermal evaporator. A photoresist is patterned with a predetermined interval using a photolithography process. After that, a thermal treatment process is performed to reflow the photoresist and so form hemisphere-shaped photoresist patterns (not shown). When the photoresist patterns and the phosphor layer 20 are simultaneously etched, the phosphor layer 20 is etched in the hemisphere-shaped patterns 22 of a similar shape to that of the photoresist patterns.

Figure 5:
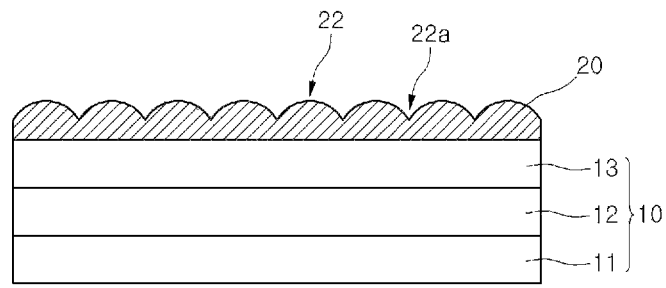

Referring to FIG. 5, the phosphor layer 20 can be formed in hemisphere-shaped patterns 22 while having a predetermined thickness. In this case, the upper surface of the LED 10 is not exposed by the phosphor layer 20.

Figure 6:
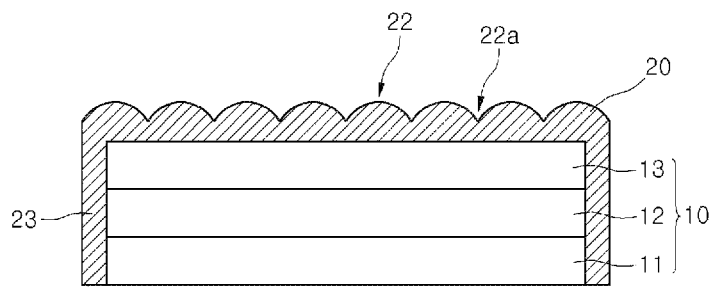

Referring to FIG. 6, the phosphor layer 20 can be formed on the lateral surface of the LED 10. A phosphor layer 23 formed on the lateral surface can have a predetermined thickness, and performs color conversion on light emitted to the lateral surfaces of the LED 10.

Figure 7:
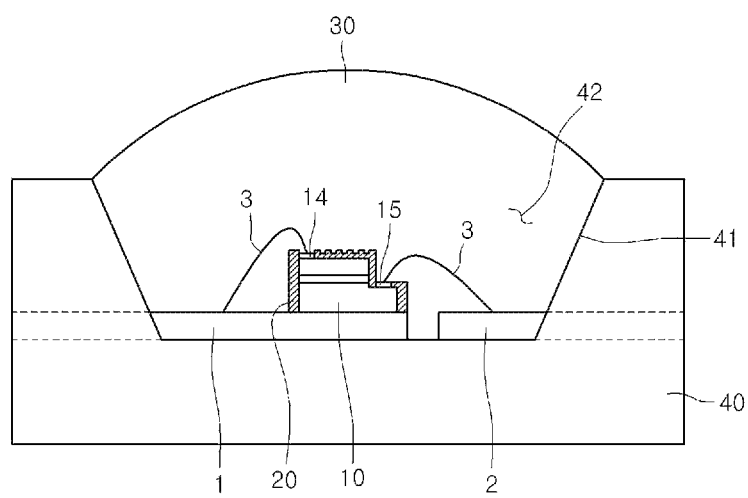
FIGS. 7 to 9 are exemplary views illustrating a light emitting device package in which an LED 10 is installed according to an embodiment.
Figure 8:
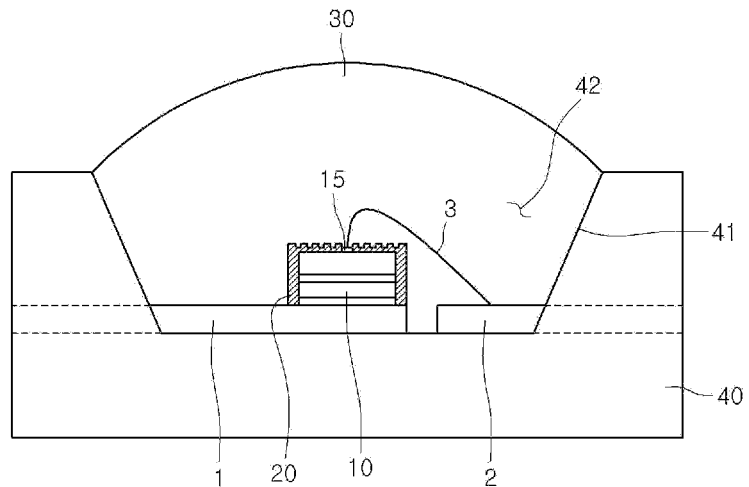
Figure 9:
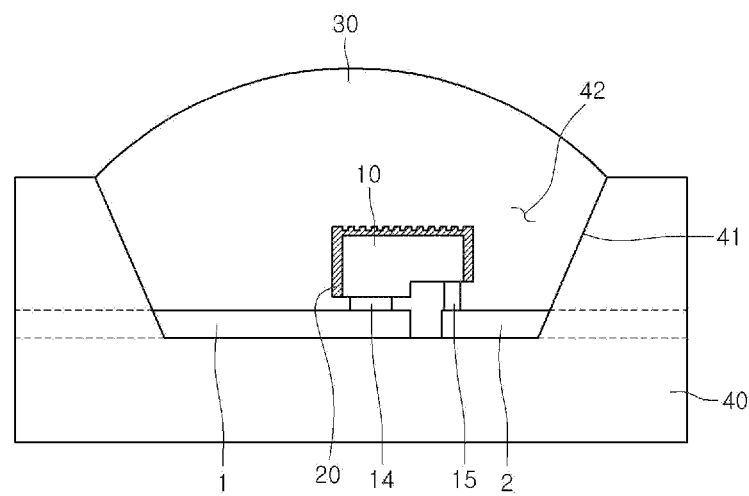

FIGS. 7 to 9 are exemplary views illustrating a light emitting device package in which an LED 10 is installed according to an embodiment.

FIGS. 7 to 9 are views explaining a manner in which an LED is installed according to the shape of the LED. FIG. 7 illustrates a lateral type LED is installed, FIG. 8 illustrates a vertical type LED is installed, and FIG. 9 illustrates a flip-chip type LED is installed.

Referring to FIG. 7, a light emitting device package includes: a substrate 40 in which a cavity 42 is formed, a first condition member 1 and a second conduction member 2 formed in the substrate 40 an LED 10 installed inside the cavity 42, and on the upper surface and the lateral surfaces of which a phosphor layer 20 is formed, a first electrode layer 15 and a second electrode layer 14 formed on the LED 10 wires 3 electrically connecting the first electrode layer 15 and the second electrode layer 14 with the first conduction member 1 and the second condition member 2, and a molding member 30 filling the cavity 42.

The cavity 42 is a region in which the LED 10 is installed, and is formed by partially removing the substrate 40. The substrate 40 can include an inclined surface 41. Also, a reflective layer (not shown) formed of Ag or Al having high light reflectivity can be formed on the inclined surface 41.

The first conduction member 1 and the second condition member 2 are formed of copper, and can pass through the substrate 40. Also, Ag or Al having high light reflectivity can be formed on the surfaces of the first conduction member 1 and the second conduction member 2.

The phosphor layer 20 is formed on the upper surface and/or the lateral surfaces of the LED 10. The phosphor layer 20 can be formed in the shape illustrated in FIGS. 1 to 6.

Therefore, in the case where the phosphor layer 20 is formed on the upper surface 10 and the lateral surfaces of the LED 10 on the whole, the LED 10 and the molding member 30 can be separated from each other by the phosphor layer 20. Also, in the case where the phosphor layer 20 is formed on only the upper surface or a portion of the upper surface of the LED 10 the molding member 30 contacts the LED 10 only through a region where the phosphor layer 20 is not formed.

The phosphor layer 20 can include a yellow phosphor for blue excitation (YAG, TAG, silicate, nitride, sulfide, selenide, etc.), and a phosphor for ultraviolet excitation (a blue light emitting phosphor, a green light emitting phosphor, and a red light emitting phosphor). A light emitting device that can emit a desired color such as white color, blue color, and green color, and red color can be realized.

The phosphor layer 20 having the patterns 21 illustrated in FIGS. 1 to 6 is formed on the LED 10 illustrated in FIGS. 7 to 9, so that light emitted from the LED 10 can be effectively emitted. Also, the phosphor layer 20 is directly formed on the LED 10 so that uniform color can be realized.

The first electrode layer 15 and the second electrode layer 14 are formed on a first condition type semiconductor layer and a second conduction type semiconductor layer of the LED 10 and electrically connected with the second condition member 2 and the first conduction member 1 through the wires 3.

The molding member 30 surrounds the LED 10. That is, the phosphor layer 20 and the molding member 30 are disposed in the upper surface direction of the LED 10 and the phosphor layer 20 the molding member 30 and the substrate 40 are disposed in the lateral direction of the LED 10. The molding member 30 can be formed using dispensing or a screen printing method.

Referring to FIG. 8, the LED package shown in FIG. 8 is similar to the LED package shown in FIG. 7 but a second conduction type semiconductor layer is directly electrically connected with a first conduction member 1, and a first electrode layer 15 electrically connected with a first conduction type semiconductor layer is electrically connected with a second conduction type member 2 through a wire 3.

Referring to FIG. 9, in the LED package shown in FIG. 9, a first electrode layer 15 and a second electrode layer 14 of an LED 10 are directly electrically connected with a first condition member 1 and a second conduction member 2 without use of wires 3.

Such a light emitting device has an excellent light extracting efficiency, and can be applied to mobile devices (cellular phones, digital cameras, MP3 players), a decorative lighting, an automobile electric parts, and a backlight for a liquid crystal display (LCD) device requiring a light emitting device that can realize uniform color.

Hereinafter, a process for manufacturing such a light emitting device is described in detail.

FIGS. 10 to 18 are views illustrating a method for manufacturing a light emitting device according to embodiments.

Figure 10:
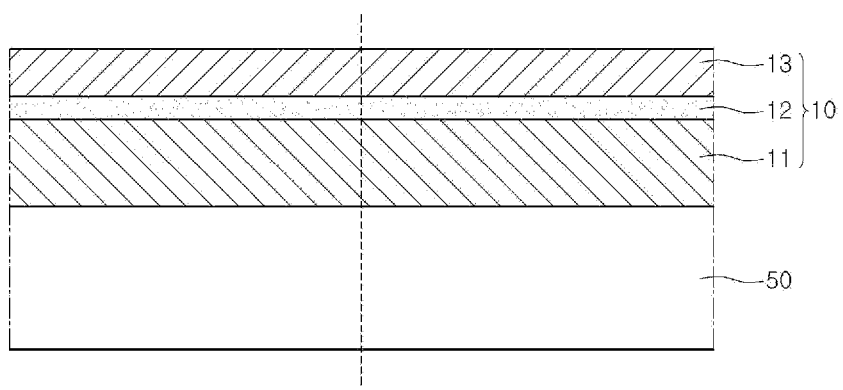
FIGS. 10 to 18 are views explaining a method for manufacturing a light emitting device according to embodiments.

First, referring to FIG. 10, a semiconductor layer 10 of a multi-layered structure is formed on a substrate 50. The semiconductor layer 10 can include a first conduction type semiconductor layer 11, an active layer 12, and a second conduction type semiconductor layer 13.

Figure 11:
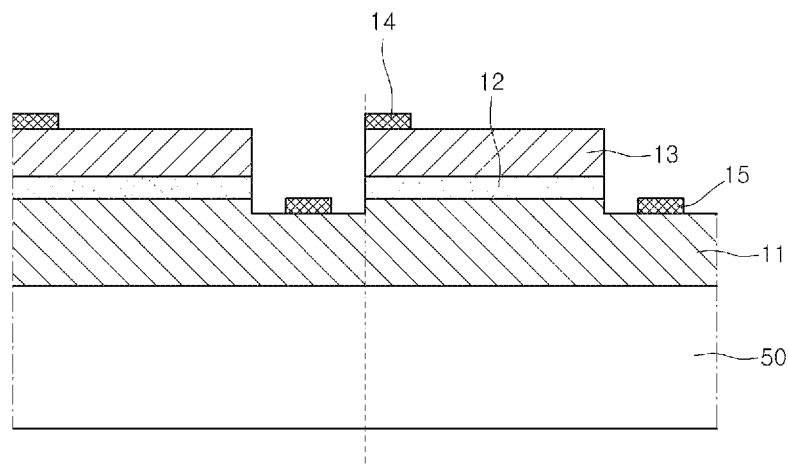

Referring to FIG. 11, the semiconductor layer 10 is etched such that the first conduction type semiconductor layer 11 is partially exposed, and a first electrode layer 15 and a second electrode layer 14 are then formed on a second conduction type semiconductor layer 13 and a first conduction type semiconductor layer 11.

Next, a phosphor layer 20 is formed on regions excluding the first and second electrode layers 14 and 15 using the above-described MOCVD, ALD, RF-sputter, b-beam, evaporator, and thermal evaporator.

Figure 12:
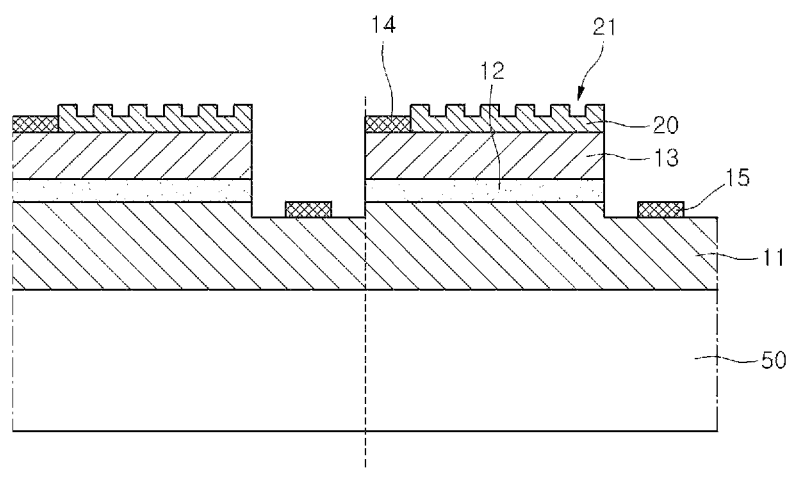

A photoresist (not shown) is patterned on the phosphor layer 20, and the phosphor layer 20 is etched to form patterns 21. After that, the photoresist is removed, so that the structure shown in FIG. 12 is obtained.

Since blue light is emitted from portions where the phosphor layer 20 is not present and blue light that passes the phosphor layer 20 is converted into yellow light in this structure, two light is mixed to form white light.

Figure 13:
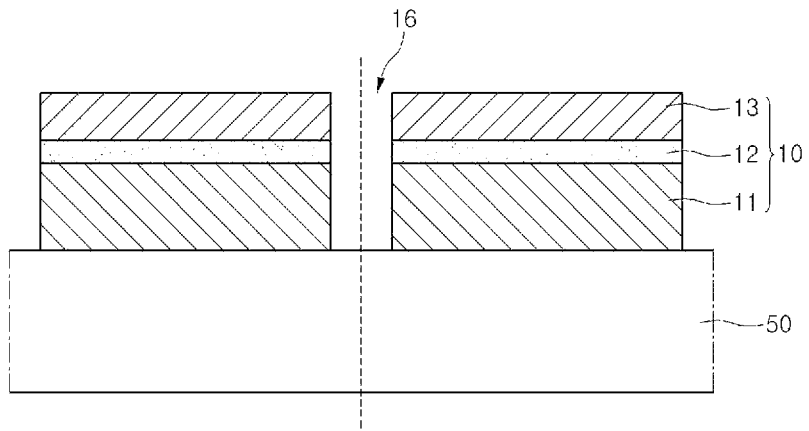
Figure 14:
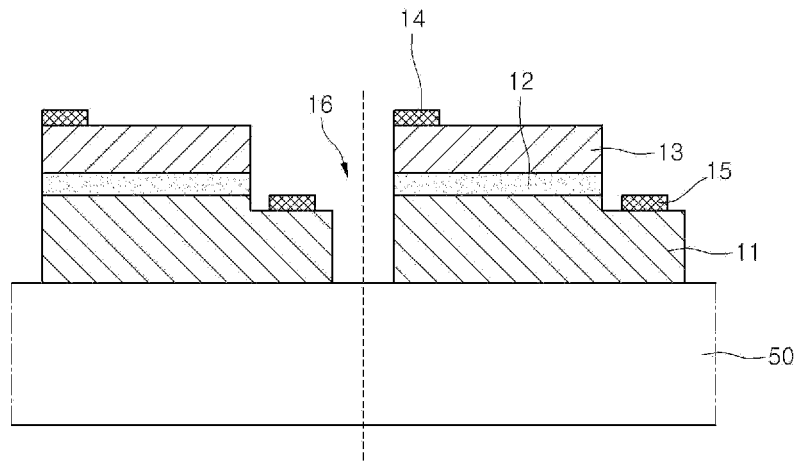

Meanwhile, referring to FIG. 10 with the semiconductor layer 10 formed on the substrate 50 trench etching is performed so that a unit device isolation region 16 is defined and a subsequent process can be performed as shown in FIG. 13.

With the unit device isolation region 16 defined as described above, referring to FIG. 14, the semiconductor layer 10 is etched such that the first conduction type semiconductor layer 11 is partially exposed in the same manner. A first electrode layer 15 is formed on the exposed portion of the first conduction type semiconductor layer 11, and a second electrode layer 14 is formed on a second conduction type semiconductor layer 13.

After that, a phosphor layer 20 is formed on the semiconductor layer 10 including the unit device isolation region 16. At this point, the phosphor layer 20 is not formed on portions where the first and second electrode layers 14 and 15 are formed.

Figure 15:
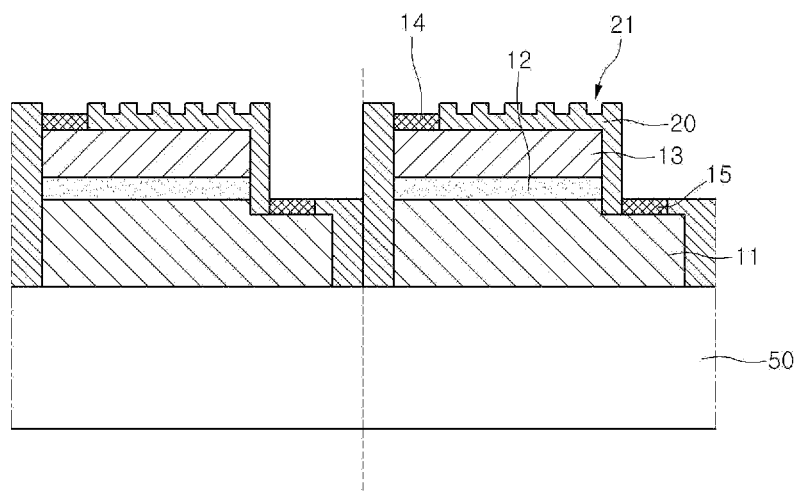

Next, when patterns 21 are formed on the phosphor layer 20 the structure shown in FIG. 15 is obtained.

At this point, when dicing is performed along the unit device isolation region 16, the phosphor layer 20 is also formed on the lateral surface of the semiconductor layer 10 as shown in FIG. 6 or FIG. 9.

Next, a process for forming a vertical light emitting device structure is described.

Figure 16:
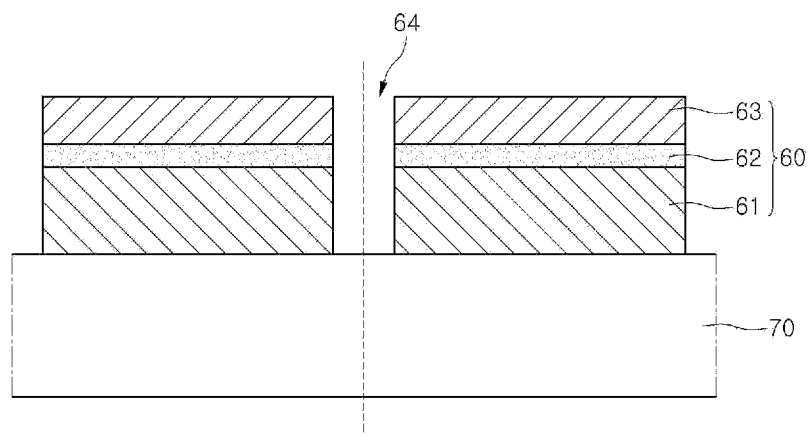

Referring to FIG. 16, a semiconductor layer 60 of a multi-layered structure is formed on a substrate 70 and a unit device isolation region 64 is etched. The semiconductor layer 60 can include a first conduction type semiconductor layer 61, an active layer 62, and a second conduction type semiconductor layer 63.

Figure 17:
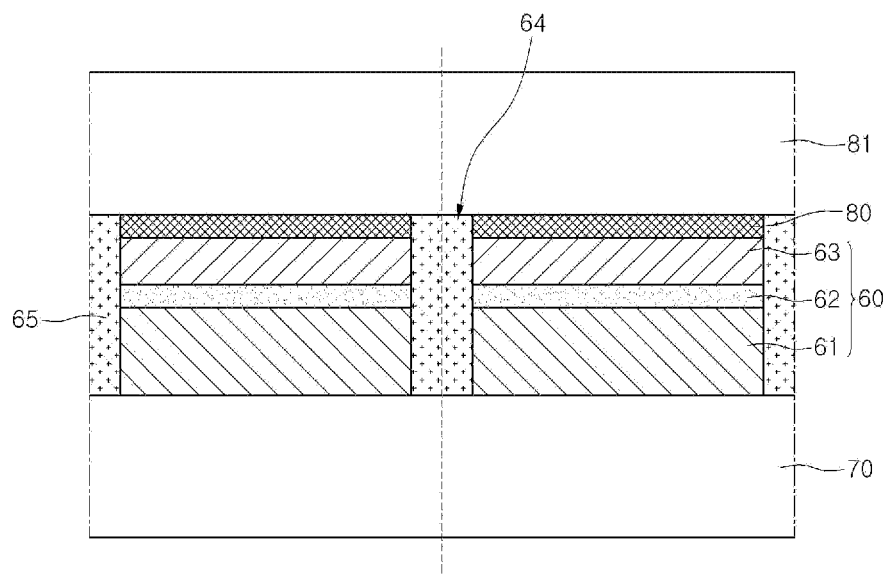

After that, referring to FIG. 17, an ohmic contact layer 80 and a support layer 81 are formed on the second conduction type semiconductor layer 63. This ohmic contact layer 80 can also serve as a reflective electrode and/or a coupling layer. The support layer 81 can be formed of metal, for example.

Also, the unit device isolation region 64 can be filled with a passivation 65 formed of a material such as a photoresist.

Figure 18:
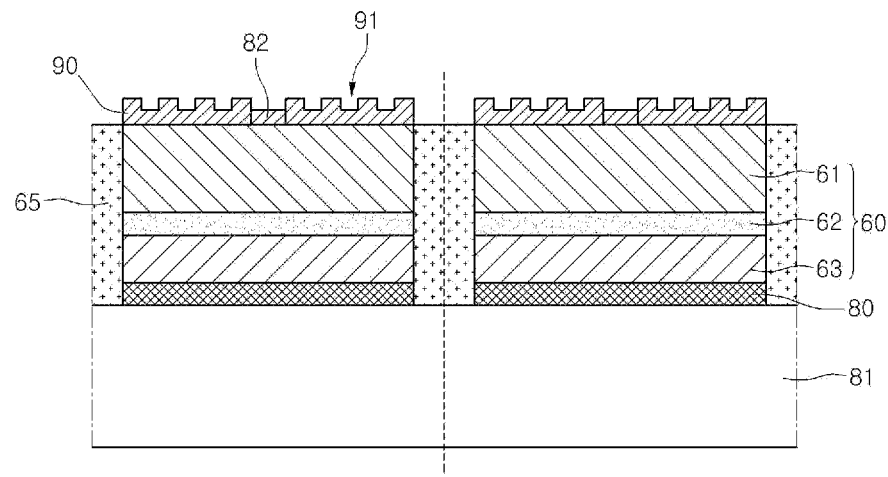

Next, the substrate 70 is removed by laser lamination or etching. A first electrode layer 82 is formed on the first conduction type semiconductor layer 61 exposed when the substrate 70 is removed as illustrated in FIG. 18.

A phosphor layer 90 is formed on the first conduction type semiconductor layer 61 excluding the first electrode layer 82, and patterned by the above process, so that patterns 91 are formed.

In the case where the patterns 91 are formed on the phosphor layer 90 an incident angle through which light can be extracted increases and so an amount of light that can get out of the phosphor layer 90 increases. Therefore, the phosphor layer 90 in which the patterns 91 are formed can improve light extraction efficiency using a photonic crystal or grating effect.

Also, in the case where the phosphor layer 90 having the patterns 91 is formed during the light emitting device manufacturing process, red, blue, and green light emitting device packages, and light emitting devices that can emit various colors can be manufactured even without a process of additionally coating phosphor during the package manufacturing process.

The embodiment is an example of explaining the spirit of the present disclosure in detail, and the present disclosure is not limited to the embodiment but can be modified in various forms, which will fall within the scope of the present disclosure.

INDUSTRIAL APPLICABILITY

A light emitting device as a light source according to an embodiment can be used for various electric apparatuses.

The invention claimed is:

1. A light emitting device package, comprising:
a supporting substrate;
an electrode layer on the supporting substrate;
a light emitting structure on the electrode layer and including a first type semiconductor layer, an active layer on the first type semiconductor layer and a second type semiconductor layer on the active layer; and
a phosphor layer on a top surface of the light emitting structure, the phosphor layer including a plurality of first portions each having a hemisphere shape,
wherein each of the first portions has a flat bottom surface,
wherein each of the first portions is directly contacted with adjacent first portions,
wherein an area of the first portions is equal to or larger than an area of the light emitting structure, and
wherein the flat bottom surfaces directly contact the light emitting structure.

2. The light emitting device of claim 1, wherein the phosphor layer is disposed on a lateral side surface of the light emitting structure.

3. The light emitting device of claim 1, further comprising:
an electrode on the top surface of the light emitting structure along a side of the top surface of the light emitting structure.

4. The light emitting device of claim 3, further comprising:
a wire connected to the electrode.

5. The light emitting device of claim 1, wherein the flat bottom surface of the first portions is larger than an upper surface of the second type semiconductor layer.

6. A light emitting device, comprising:
a light emitting structure including a first type semiconductor layer, an active layer on the first type semiconductor layer and a second type semiconductor layer on the active layer; and
a phosphor layer on a top surface of the light emitting structure, the phosphor layer including a plurality of first portions each having a hemisphere shape,
wherein each of the first portions has a flat bottom surface,
wherein each of the first portions is directly contacted with adjacent first portions,
wherein an area of the first portions is equal to or larger than an area of the light emitting structure, and
wherein the flat bottom surfaces directly contact the light emitting structure.

7. The light emitting device of claim 6, wherein the plurality of first portions has a top surface higher than that of the plurality of second portions.

8. The light emitting device of claim 6, wherein the phosphor layer has at least two side layers contacted with both side surfaces of the first type semiconductor layer, the active layer and the second type semiconductor layer.

9. The light emitting device of claim 6, wherein the first and second portions substantially cover an entire top surface of the light emitting structure.

10. The light emitting device of claim 6, wherein each of the first portions has substantially the same thickness as each other on the top surface of the light emitting structure.

11. The light emitting device of claim 6, further comprising:
an electrode on the top surface of the light emitting structure along a side of the top surface of the light emitting structure.

12. The light emitting device of claim 11, further comprising:
a wire connected to the electrode.

13. The light emitting device of claim 6, wherein the flat bottom surface of the first portions is larger than an upper surface of the second type semiconductor layer.

* * * * *